United States Patent
Chae et al.

(10) Patent No.: US 10,256,095 B2
(45) Date of Patent: Apr. 9, 2019

(54) METHOD FOR HIGH THROUGHPUT USING BEAM SCAN SIZE AND BEAM POSITION IN GAS CLUSTER ION BEAM PROCESSING SYSTEM

(71) Applicant: TEL Epion Inc., Billerica, MA (US)

(72) Inventors: Soo Doo Chae, Guilderland, NY (US); Noel Russell, Waterford, NY (US); Joshua LaRose, Gansevoort, NY (US); Nicholas Joy, Ballston Lake, NY (US); Luis Fernandez, Somerville, MA (US); Allen J. Leith, Brookline, NH (US); Steven P. Caliendo, Ashby, MA (US); Yan Shao, Andover, MA (US); Vincent Lagana-Gizzo, East Greenbush, NY (US)

(73) Assignee: TEL Epion Inc., Billerica, MA (US)

( * ) Notice: Subject to any disclaimer, the term of this patent is extended or adjusted under 35 U.S.C. 154(b) by 166 days.

(21) Appl. No.: 15/266,639

(22) Filed: Sep. 15, 2016

(65) Prior Publication Data

US 2017/0077001 A1 Mar. 16, 2017

Related U.S. Application Data

(60) Provisional application No. 62/219,319, filed on Sep. 16, 2015.

(51) Int. Cl.
*H01L 21/02* (2006.01)
*H01L 21/66* (2006.01)
(Continued)

(52) U.S. Cl.
CPC ...... *H01L 21/02678* (2013.01); *G05B 19/406* (2013.01); *H01J 37/304* (2013.01);
(Continued)

(58) Field of Classification Search
CPC ......... H01L 21/26566; H01L 21/02675; H01L 21/02678; H01L 22/20; H01L 21/263; G05B 19/406

See application file for complete search history.

(56) References Cited

U.S. PATENT DOCUMENTS

2002/0070361 A1* 6/2002 MacK ................... C23C 14/221
250/505.1
2003/0086182 A1* 5/2003 Tanaka ............... B23K 26/0604
359/719

(Continued)

FOREIGN PATENT DOCUMENTS

KR 102011007868 A 1/2011
WO 2006116506 A1 11/2006

OTHER PUBLICATIONS

ISR/KR, International Search Report and Written Opinion issued in counterpart PCT Application No. PCT/US2016/051960 dated Dec. 9, 2016, 11 pp.

*Primary Examiner* — Michael Jung
(74) *Attorney, Agent, or Firm* — Wood Herron & Evans LLP

(57) ABSTRACT

A system and method for performing location specific processing of a workpiece is described. The method includes placing a microelectronic workpiece in a beam processing system, selecting a beam scan size for a beam scan pattern that is smaller than a dimension of the microelectronic workpiece, generating a processing beam, and processing a target region of the microelectronic workpiece by irradiating the processing beam along the beam scan pattern onto the target region within the beam scan size selected for processing the microelectronic workpiece.

11 Claims, 4 Drawing Sheets

(51) Int. Cl.
*G05B 19/406* (2006.01)
*H01L 21/265* (2006.01)
*H01L 21/263* (2006.01)
*H01J 37/304* (2006.01)

(52) U.S. Cl.
CPC ...... *H01L 21/02675* (2013.01); *H01L 21/263* (2013.01); *H01L 21/26566* (2013.01); *H01L 22/20* (2013.01); *G05B 2219/40624* (2013.01); *G05B 2219/45031* (2013.01); *H01J 2237/30483* (2013.01); *H01J 2237/31* (2013.01); *H01L 22/12* (2013.01)

(56) References Cited

U.S. PATENT DOCUMENTS

| | | | | |
|---|---|---|---|---|
| 2008/0048132 A1* | 2/2008 | Gwinn | .................... | H01J 37/09 250/492.3 |
| 2009/0057574 A1* | 3/2009 | Wagner | ................ | H01J 37/302 250/492.21 |
| 2010/0193472 A1 | 8/2010 | Tabat et al. | | |
| 2010/0193701 A1 | 8/2010 | Tabat et al. | | |
| 2010/0207041 A1* | 8/2010 | Sato | ........................ | H01J 37/20 250/492.3 |
| 2010/0221849 A1 | 9/2010 | Cheng et al. | | |
| 2011/0244374 A1* | 10/2011 | Han | ...................... | B82Y 10/00 430/5 |
| 2013/0306597 A1* | 11/2013 | Gunji | ....................... | C23F 4/00 216/66 |
| 2014/0004688 A1 | 1/2014 | Asai et al. | | |
| 2014/0210506 A1 | 7/2014 | Wu et al. | | |
| 2015/0011026 A1* | 1/2015 | Oishi | ...................... | H01L 22/20 438/14 |
| 2015/0242563 A1* | 8/2015 | Wieland | ................. | G03B 27/42 438/798 |
| 2016/0041461 A1* | 2/2016 | Hirabayashi | .............. | G03F 1/22 430/5 |
| 2016/0099168 A1* | 4/2016 | Ryan | ................ | H01L 21/76224 438/423 |
| 2016/0208415 A1* | 7/2016 | Bencher | ................ | C30B 19/08 |

\* cited by examiner

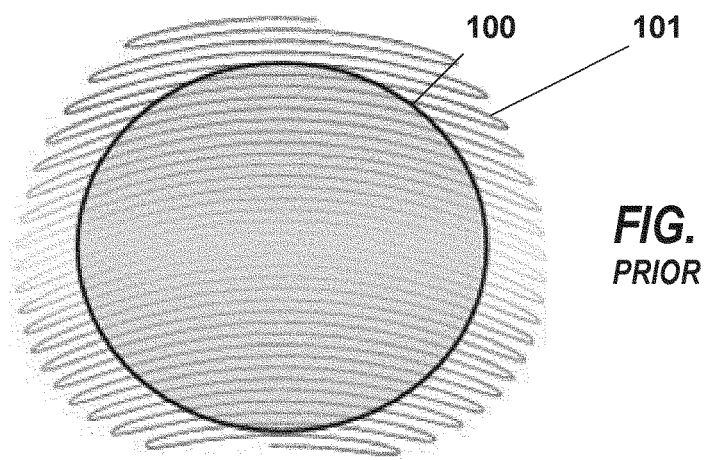
FIG. 1A
PRIOR ART
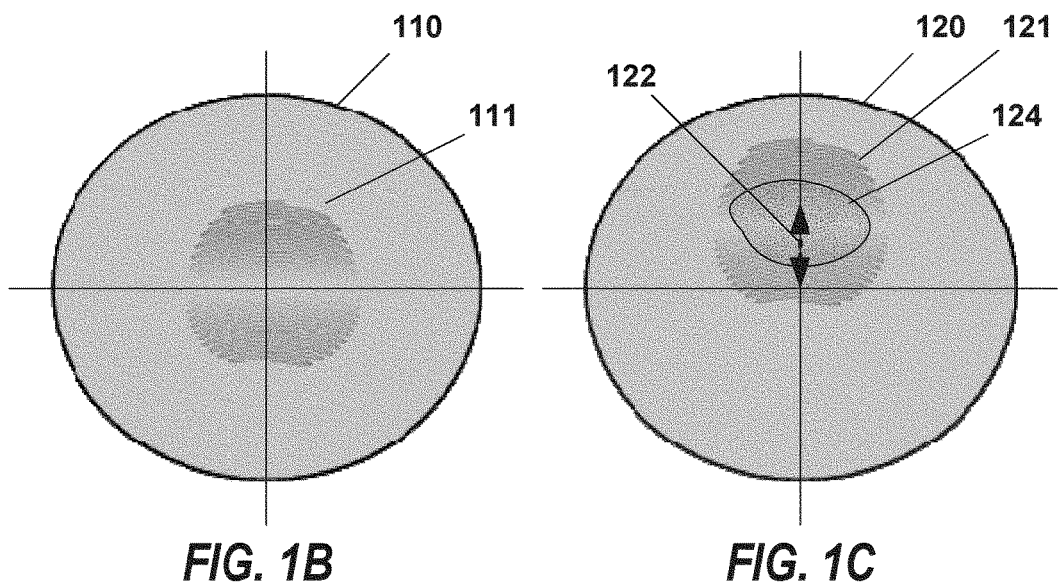
FIG. 1B
FIG. 1C

METHOD FOR HIGH THROUGHPUT USING BEAM SCAN SIZE AND BEAM POSITION IN GAS CLUSTER ION BEAM PROCESSING SYSTEM

RELATED APPLICATIONS

Pursuant to 37 C.F.R. § 1.78(a)(4), this application claims the benefit of and priority to U.S. Provisional Application No. 62/219,319 filed on Sep. 16, 2015 which is expressly incorporated by reference herein in its entirety.

FIELD OF INVENTION

The field of invention relates generally to the fields of material processing and semiconductor integrated circuit manufacturing and, more specifically but not exclusively, relates to the location specific processing of various workpiece attributes.

BACKGROUND OF THE INVENTION

Description of Related Art

With the advancement of substrate size and feature scale in semiconductor device manufacturing from one technology node to the next, as well as the increasing complexity of devices transitioning from planar to non-planar, the need for advanced precision control of feature attributes across large diameter substrates is rapidly escalating. Current methodologies, including beam processing systems as well as non-beam processing systems, such as spatially controlled plasma and non-plasma processing systems, are contemplated for advanced corrective processing schemes.

As an example, location specific processing by gas cluster ion beam (GCIB) is a highly precise method, which among other attributes, enables advanced process control of feature attribute uniformity (e.g., thickness uniformity). In a GCIB etching process, a GCIB can have a high local etch rate in a focused beam, which combined with location specific processing (LSP) algorithms, enables high-precision correction of incoming or downstream thickness uniformity.

Clusters of gas molecules are formed by condensation that occurs during expansion of a high pressure gas mixture through a nozzle. A beam of these clusters is directed through an electron source, where they are ionized by electron impact, then accelerated by up to 60 KV into the process chamber, where the wafer is scanned through the beam.

Workpieces are scanned with precisely controlled speed up to 150 cm/s, for example, which can be modulated at every point on the wafer using the processing algorithm to precisely control local treatment or etch rate based on a downloaded map or via an integrated metrology option. However, beam processing systems, such as GCIB processing systems, suffer from poor throughput. In part, beam processing systems scan and process the entire workpiece, thus potentially treating areas of the workpiece not needing treatment, and fail to limit the beam scan to the target region for correction.

SUMMARY OF THE INVENTION

Embodiments of the invention relate generally to the fields of material processing and semiconductor integrated circuit manufacturing and, more specifically but not exclusively, to the location specific processing of various workpiece attributes.

According to one embodiment, a method for performing location specific processing of a workpiece is described. The method includes placing a microelectronic workpiece in a beam processing system, selecting a beam scan size for a beam scan pattern that is smaller than a dimension of the microelectronic workpiece, generating a processing beam, and processing a target region of the microelectronic workpiece by irradiating the processing beam along the beam scan pattern onto the target region within the beam scan size selected for processing the microelectronic workpiece.

According to another embodiment, a processing system configured to perform location specific processing on a microelectronic workpiece is described. The system includes a beam processing system configured to treat a workpiece with a processing beam, and a multi-process controller programmably configured to: select a beam scan size for a beam scan pattern that is smaller than a dimension of the microelectronic workpiece; generate the processing beam; and process a target region of the microelectronic workpiece by irradiating the processing beam along the beam scan pattern onto the target region within the beam scan size selected for processing the microelectronic workpiece.

BRIEF DESCRIPTION OF THE DRAWINGS

In the accompanying drawings:

FIG. 1A illustrates a conventional beam scan pattern on a workpiece to be processed FIGS. 1B through 1C illustrate different beam scan patterns on a workpiece to be processed according to various embodiments;

DETAILED DESCRIPTION OF SEVERAL EMBODIMENTS

Figure 2:
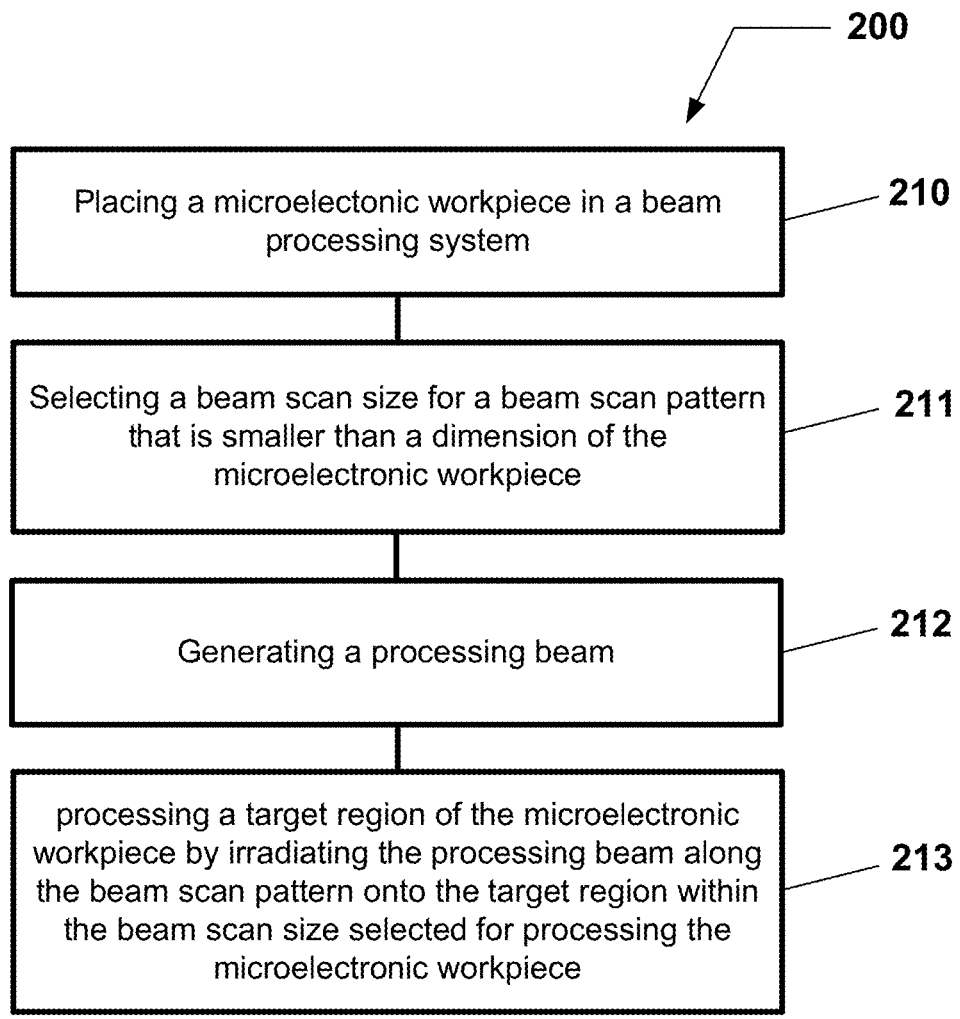
FIG. 2 is a flow chart illustrating a method for processing a workpiece according to an embodiment.

Methods and systems for performing location specific and corrective processing of a workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Workpiece" as used herein generically refers to the object being processed in accordance with the invention. The workpiece may include any material portion or structure of a device, particularly a semiconductor or other electronics device, and may, for example, be a base workpiece structure, such as a semiconductor wafer or a layer on or overlying a base workpiece structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of workpieces, but this is for illustrative purposes only and not limitation.

As described in part above, beam processing systems, such as GCIB processing systems, suffer from poor throughput. In part, beam processing systems scan and process the entire workpiece, thus potentially treating areas of the workpiece not needing treatment, and fail to limit the beam scan to the target region for correction. As shown in FIG. 1A, a conventional beam scan pattern 101 covers the entire surface area of a workpiece 100 and extends beyond a peripheral edge of the workpiece 100. For example, to process a 300 mm workpiece, a 350 mm diameter area was scanned, including 50 mm over-scan, regardless of the size of the area targeted for correction.

Therefore, according to various embodiments, to improve throughput, a beam scan size 111, 121 can be controlled to be smaller than the size of a workpiece 110, 120 (see FIGS. 1B and 1C). And, to improve uniformity, the beam position can be controlled (see FIG. 1C). If the non-uniform region is not centered and not matched with the beam scan area, the beam scan area can be offset distance 122 to align the beam scan area 121 with the region targeted for correction by adjusting the scanner position and data map to improve the uniformity. The scan area offset can be entered manually or can be automatically determined by software algorithms that calculate the center of the non-uniform area. The scan area diameter can also be adjusted depending on the incoming uniformity and corrective treatment or etch capability desired. And, for example, the scan area can be limited to meet a specific throughput requirement.

To improve corrective capability, methods and systems for performing location specific processing of a workpiece with enhanced corrective capability are described according to various embodiments. FIG. 2 provides a flow chart 200 illustrating a method for performing location specific processing of a workpiece according to an embodiment, and FIG. 1C provides an illustration of a target region 124 on workpiece 120 to be processed.

The method illustrated in flow chart 200 begins in 210 with placing the microelectronic workpiece 120 in a beam processing system. The microelectronic workpiece 120 can, for example, include a semiconductor substrate, wherein the dimension of the microelectronic workpiece is a diameter, or a flat panel display or device, wherein the dimension of the microelectronic workpiece is a width or length of the panel.

In 211, a beam scan size is selected for a beam scan pattern that is smaller than a dimension of the microelectronic workpiece 120. In 212, a processing beam is generated. And, in 213, the target region 124 of the microelectronic workpiece is processed by irradiating the processing beam along the beam scan pattern onto the target region 124 within the beam scan size selected for processing the microelectronic workpiece.

The workpiece attribute to be treated or corrected within the target region 124 can include geometrical, mechanical, electrical, and/or optical parameters associated with the microelectronic workpiece 120, any layer or sub-layer formed on the microelectronic workpiece 120, and/or any portion of a device on the microelectronic workpiece 120. For example, the workpiece attribute can include a film thickness, a surface and/or interfacial roughness, a surface contamination, a feature depth, a trench depth, a via depth, a feature width, a trench width, a via width, a critical dimension (CD), a surface roughness, or an electrical resistance, or any combination of two or more thereof.

In various embodiments, the processing beam includes a neutral beam, a charged particle beam, a gas cluster beam (GCB), or a gas cluster ion beam (GCIB), or any portion thereof, or any combination thereof. The processing can include scanning the microelectronic workpiece 120 through the processing beam, or scanning the processing beam across the microelectronic workpiece 120.

Using the beam processing system, an applied property of the beam processing system can be spatially modulated, based at least in part on parametric data from workpiece 120, as a function of position on the microelectronic workpiece 120 to achieve a target profile of a workpiece attribute. For example, the applied property can include a beam dose or dwell time, an acceleration potential, a background gas pressure through which the beam passes, a mass flow rate, a total pressure, a total temperature, a beam composition, etc. The corrective process can include an etch process, a deposition process, a growth process, a smoothing process, a doping process, a modification process, or any combination of two or more thereof to achieve a target profile of a workpiece attribute of the microelectronic workpiece 120.

The method can additionally include: collecting parametric data relating to at least a portion of the microelectronic workpiece, wherein the parametric data includes a spatial profile of a measured attribute of the microelectronic workpiece; identifying the target region for corrective processing using the collected parametric data; and selecting the beam scan size based on a dimension of the target region. Furthermore, the method can include determining a position for the beam scan pattern on the microelectronic workpiece based on the location of the target region.

The beam scan size and the position of the beam scan pattern can be selected such that the beam scan pattern fully covers the target region and the beam scan size exceeds the size of the target region by no more than 50% based upon areal size.

Figure 3:
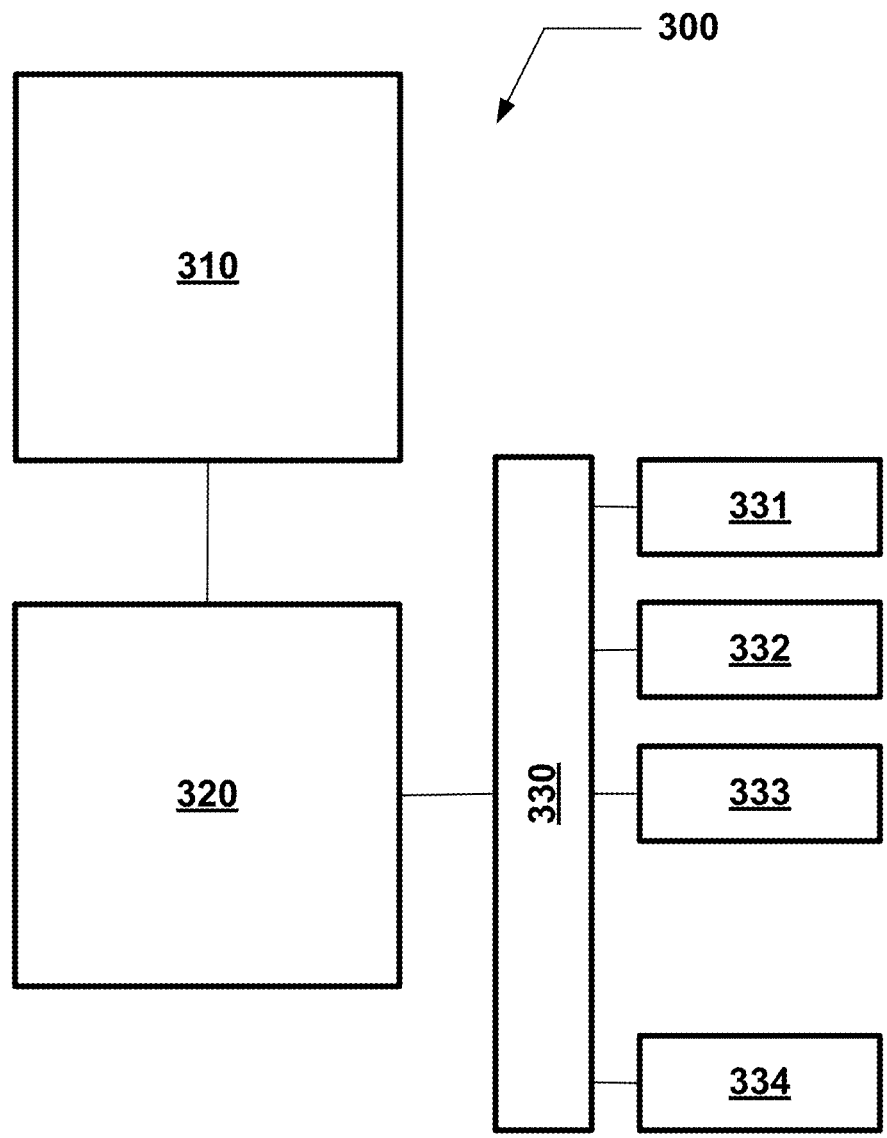
FIG. 3 provides an illustration of a corrective processing system according to an embodiment.

Turning now to FIG. 3, a processing system 300 configured to perform corrective processing on a microelectronic workpiece is described according to various embodiments. The processing system 300 includes a corrective processing system 310 configured to treat a microelectronic workpiece with a corrective process, and a multi-process controller 320 having a data interface 330 programmably configured to: receive a first set of parametric data from a first source 331 that diagnostically relates to at least a first portion of a microelectronic workpiece; optionally receive a second set of parametric data from a second source 332 different than the first source 331 that diagnostically relates to at least a second portion of the microelectronic workpiece; generate a corrective process; and process a target region of the microelectronic workpiece by applying the corrective process to the target region using a combination of the first set of parametric data and the optional second set of parametric data. The multi-process controller 320 may also interface with additional data sources 333, 334.

Processing system 300 can include a spatial modulation system configured to spatially modulate an applied property of the corrective process, based at least in part on the first and second sets of parametric data, as a function of position on the microelectronic workpiece to achieve a target profile of a workpiece attribute. Furthermore, processing gsystem 300 can include a metrology system configured to collect at least the first set of parametric data for one or more microelectronic workpieces.

Figure 4:
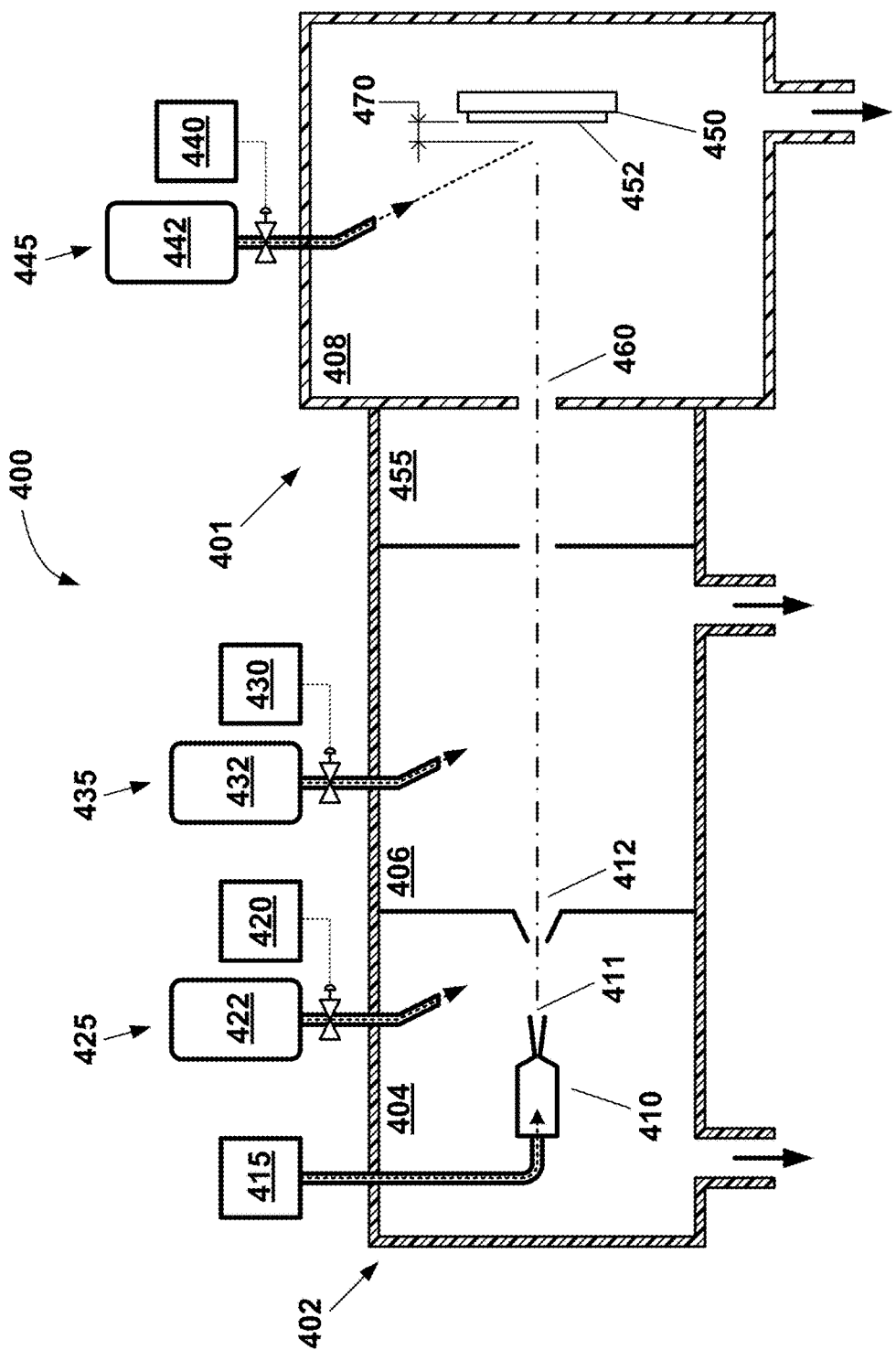
FIG. 4 provides an illustration of a beam processing system according to an embodiment.

According to one embodiment, the corrective processing system 310 includes a beam processing system. As shown in FIG. 4, a gas cluster ion beam (GCIB) processing system 400 is described according to an embodiment. In particular, GCIB processing system 400 includes a GCIB source 401 having a nozzle assembly 410 that is configured to introduce a primary gas from a process gas supply system 415 through the nozzle assembly 410 to a vacuum vessel 402 in order to produce a gas cluster beam. An ionizer 412 is positioned downstream from the nozzle assembly 410, and configured to ionize the gas cluster beam to produce a GCIB.

The GCIB processing system 400 further includes a workpiece holder 450, upon which a workpiece 452 to be processed is affixed and scanned within vacuum vessel 402. Vacuum vessel 402 comprises three communicating chambers, namely, a source chamber 404, an ionization/acceleration chamber 406, and a processing chamber 408 to provide a reduced-pressure enclosure. The three chambers are evacuated to suitable operating pressures by one or more vacuum pumping systems. In the three communicating chambers 404, 406, 408, a gas cluster beam can be formed in the first chamber (source chamber 404), while a GCIB can be formed in the second chamber (ionization/acceleration chamber 406) wherein the gas cluster beam is ionized and accelerated. Then, in the third chamber (processing chamber 408), the accelerated GCIB may be utilized to treat workpiece 452. The vacuum vessel 402 may also include a pressure cell chamber 455. The pressure cell chamber 455 is coupled to an inert gas supply system (not shown in FIG. 4) that supplies a background gas to the pressure cell chamber 455 for elevating the pressure in the pressure cell chamber 455.

The GCIB processing system 400 can further include a secondary gas source (425, 435, 445), wherein the secondary gas source (425, 435, 445) includes a secondary gas supply system (422, 432, 442) that delivers a secondary gas, and a secondary gas controller (420, 430, 440) that operatively controls the flow of the secondary gas injected into the GCIB processing system 400 downstream of the nozzle assembly 410. In one embodiment, the secondary gas source 425 is arranged to deliver the secondary gas into the source chamber 404 downstream of the exit 411 of the nozzle assembly 410. In another embodiment, the secondary gas source 435 is arranged to deliver the secondary gas into the ionization/acceleration chamber 406 downstream of a skimmer 412. In another embodiment, the secondary gas source 445 is arranged to deliver the secondary gas into the processing chamber 408 downstream of a final aperture 460. In another embodiment, any combination of the secondary gas source (425, 435, 445) may be used.

In another embodiment, the secondary gas source 445 is arranged to deliver the secondary gas into the processing chamber 408 downstream of the final aperture 460 and along a path that intersects the GCIB at a location spaced away from the exposed surface of workpiece 452 by a separation distance 470 (for example, the secondary gas is directed to the processing chamber 408 at or near an impact region of the GCIB with the substrate). Separation distance 470 may be a distance less than 10 mm, less than 5 mm, less than 2 mm, or substantially nil (the secondary gas may be a jet or beam that intersects the GCIB at the exposed surface of the substrate).

The secondary gas controller (420, 430, 440) may be coupled to one or more flow control valves, flow sensors, or pressure sensors. And, the secondary gas controller (420, 430, 440) can control a pressure (e.g., total/stagnation pressure) at which the secondary gas is injected, or a flow rate of the secondary gas, or combination thereof.

Additional details concerning the design of a gas cluster ion beam system are provided in U.S. Patent Application Publication No. 2010/0193701A1, entitled "Multiple Nozzle Gas Cluster Ion Beam System" and filed on Apr. 23, 2009; and U.S. Patent Application Publication No. 2010/0193472A1, entitled "Multiple Nozzle Gas Cluster Ion Beam Processing System and Method of Operating" and filed on Mar. 26, 2010; the contents of which are herein incorporated by reference in their entirety.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for performing location specific processing of a microelectronic workpiece, the method comprising:
    collecting parametric data relating to at least a portion of the microelectronic workpiece, the parametric data including a spatial profile of a measured attribute of the microelectronic workpiece;
    identifying a target region for corrective processing using the collected parametric data;
    placing a microelectronic workpiece in a beam processing system;
    selecting a beam scan size for a beam scan pattern that is smaller than a dimension of the microelectronic workpiece and based on a dimension of the target region;
    generating a processing beam; and
    processing the target region of the microelectronic workpiece by irradiating the processing beam along the beam scan pattern onto the target region within the beam scan size selected for processing the microelectronic workpiece,
    wherein the processing beam includes a neutral beam, a charged particle beam, a gas cluster beam (GCB), or a gas cluster ion beam (GCIB), or any portion thereof, or any combination thereof.

2. The method of claim 1, wherein the processing includes:
    scanning the microelectronic workpiece through the processing beam; and
    confining a spatial range of the scanning within the beam scan size selected for processing the microelectronic workpiece.

3. The method of claim 1, wherein the processing includes:
    scanning the processing beam across the microelectronic workpiece; and confining a spatial range of the scanning within the beam scan size selected for processing the microelectronic workpiece.

4. The method of claim 1, wherein the microelectronic workpiece includes a semiconductor substrate, and the dimension of the microelectronic workpiece is a diameter, or wherein the microelectronic workpiece includes a flat panel display or device, and the dimension of the microelectronic workpiece is a width or length of the panel.

5. The method of claim 1, further comprising:
determining a position for the beam scan pattern on the microelectronic workpiece based on the location of the target region.

6. The method of claim 5, wherein the beam scan size and the position of the beam scan pattern are selected such that the beam scan pattern fully covers the target region and the beam scan size exceeds the size of the target region by no more than 50% based upon areal size.

7. The method of claim 5, further comprising:
spatially modulating an applied property of the processing beam, based at least in part on the parametric data, as a function of position on the microelectronic workpiece to achieve a target profile of the measured attribute.

8. The method of claim 7, wherein the measured attribute comprises a film thickness, a surface roughness, a surface contamination, a feature depth, a trench depth, a via depth, a feature width, a trench width, a via width, a critical dimension (CD), a surface roughness, or an electrical resistance, or any combination of two or more thereof.

9. The method of claim 7, wherein the applied property of the processing beam includes a beam dose.

10. The method of claim 7, wherein the applied property of the processing beam includes a beam dose, a beam area, a beam profile, a beam intensity, a beam scanning rate, or a dwell time, or any combination of two or more thereof.

11. The method of claim 1, wherein the processing beam performs an etch process, a deposition process, a growth process, a smoothing process, a doping process, a modification process, or any combination of two or more thereof to achieve a target profile an attribute of the microelectronic workpiece.

* * * * *